United States Patent
Reyzin et al.

(10) Patent No.: US 7,280,363 B2
(45) Date of Patent: Oct. 9, 2007

(54) APPARATUS FOR CONTROLLING THERMAL INTERFACE BETWEEN COLD PLATE AND INTEGRATED CIRCUIT CHIP

(75) Inventors: Ilya Reyzin, Williamsville, NY (US); Mohinder Singh Bhatti, Amherst, NY (US); Lawrence P. Scherer, Lockport, NY (US); Andrew R. Hayes, Clarence Center, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 304 days.

(21) Appl. No.: 11/040,623

(22) Filed: Jan. 21, 2005

(65) Prior Publication Data

US 2006/0164807 A1    Jul. 27, 2006

(51) Int. Cl.
*H05K 7/20* (2006.01)
*H01B 9/06* (2006.01)
*H02G 3/03* (2006.01)
*F28F 7/00* (2006.01)

(52) U.S. Cl. ............... 361/719; 361/699; 361/704; 361/702; 361/701; 174/15.1; 165/80.4

(58) Field of Classification Search ...... 165/80.2–80.4; 174/15.1–15.2, 16.3; 361/688–702, 712–719, 361/704, 707, 709–711, 740, 752–756; 257/704–727, 257/675; 62/259.2
See application file for complete search history.

(56) References Cited

U.S. PATENT DOCUMENTS

| | | | |
|---|---|---|---|
| 4,246,597 A * | 1/1981 | Cole et al. ................. 257/713 |
| 4,587,595 A | 5/1986 | Staples | |
| 4,715,438 A | 12/1987 | Gabuzda et al. | |
| 4,716,494 A | 12/1987 | Bright et al. | |
| 4,733,293 A | 3/1988 | Gabuzda | |
| 4,928,207 A * | 5/1990 | Chrysler et al. ............ 361/700 |
| 4,986,126 A | 1/1991 | Lawless | |
| 5,083,373 A * | 1/1992 | Hamburgen ............. 29/890.03 |
| 5,097,385 A * | 3/1992 | Chao-Fan Chu et al. ... 361/703 |
| 5,294,830 A * | 3/1994 | Young et al. ............... 257/714 |
| 5,299,632 A | 4/1994 | Lee | |
| 5,304,735 A | 4/1994 | Earl et al. | |
| 5,331,507 A | 7/1994 | Kyung et al. | |
| 5,339,215 A | 8/1994 | Nishiguchi | |
| 5,380,213 A | 1/1995 | Piorunneck et al. | |
| 5,396,402 A | 3/1995 | Perugini et al. | |
| 5,437,328 A | 8/1995 | Simons | |

(Continued)

*Primary Examiner*—Anatoly Vortman
*Assistant Examiner*—Bradley H Thomas
(74) *Attorney, Agent, or Firm*—Patrick M. Griffin

(57) ABSTRACT

The invention provides a heat sink device for receiving heat generated by an electrical chip. The heat sink device includes a cold plate having a bottom surface for receiving heat from the electrical chip and a top surface opposite of the bottom surface. The heat sink device also includes a finger member having a rounded tip centered on the top surface. The heat sink device also includes a force generating device having an anvil spaced from the finger member and a compressible member compressed between the anvil and the finger member. The compressible member generates a pressing force urging the finger member and the top surface together. The heat sink device also includes a moving device operable to move one of the anvil and the finger member relative to the other to change the pressing force generated by the compressible member.

10 Claims, 3 Drawing Sheets

U.S. PATENT DOCUMENTS

| | | |
|---|---|---|
| 5,447,750 A | 9/1995 | Nishiguchi |
| 5,595,240 A | 1/1997 | Daikoku et al. |
| 5,617,292 A | 4/1997 | Steiner |
| 5,623,594 A | 4/1997 | Swamy |
| 5,883,782 A | 3/1999 | Thurston et al. |
| 5,923,086 A * | 7/1999 | Winer et al. ................ 257/713 |
| 5,966,289 A * | 10/1999 | Hastings et al. ............ 361/704 |
| 6,019,166 A * | 2/2000 | Viswanath et al. ........ 165/80.4 |
| 6,035,513 A | 3/2000 | Batten, Jr. |
| 6,058,014 A * | 5/2000 | Choudhury et al. ........ 361/704 |
| 6,061,239 A | 5/2000 | Blomquist |
| 6,101,093 A | 8/2000 | Wong et al. |
| 6,160,704 A | 12/2000 | Rusate |
| 6,219,238 B1 | 4/2001 | Andros et al. |
| 6,347,036 B1 | 2/2002 | Yeager et al. |
| 6,374,906 B1 * | 4/2002 | Peterson et al. ........... 165/80.3 |
| 6,392,889 B1 | 5/2002 | Lee et al. |
| 6,462,945 B2 * | 10/2002 | Sloan et al. ................ 361/687 |
| 6,462,951 B2 * | 10/2002 | Letourneau ................. 361/704 |
| 6,724,632 B2 * | 4/2004 | Lee et al. ................... 361/719 |
| 6,751,098 B2 * | 6/2004 | Dailey et al. ............... 361/704 |
| 6,778,397 B2 | 8/2004 | Segala |
| 7,009,843 B2 * | 3/2006 | Lee et al. ................... 361/704 |

\* cited by examiner

APPARATUS FOR CONTROLLING THERMAL INTERFACE BETWEEN COLD PLATE AND INTEGRATED CIRCUIT CHIP

FIELD OF THE INVENTION

The invention relates to a heat sink device for absorbing heat from an electrical chip.

BACKGROUND OF THE INVENTION

Electrical chips, such as those associated with integrated circuits, generate heat which can damage the chip. Heat must be directed away from the electrical chip or the life span of the electrical chip may diminish. Furthermore, the heat generated by the electrical chip can damage adjacent structures. Examples of prior art heat sink devices used to extract heat from electrical chips include U.S. Pat. Nos. 4,345,267; 4,587,595; and 4,986,126.

SUMMARY OF THE INVENTION

The invention provides a heat sink device for receiving heat generated by an electrical chip. The heat sink device includes a cold plate having a bottom surface for receiving heat from the electrical chip and a top surface opposite of the bottom surface. The heat sink device also includes a finger member having a rounded tip centered on the top surface. The heat sink device also includes a force generating device having an anvil spaced from the finger member and a compressible member compressed between the anvil and the finger member. The compressible member generates a pressing force urging the finger member and the top surface together. The heat sink device also includes a moving device operable to move one of the anvil and the finger member relative to the other to change the pressing force generated by the compressible member.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
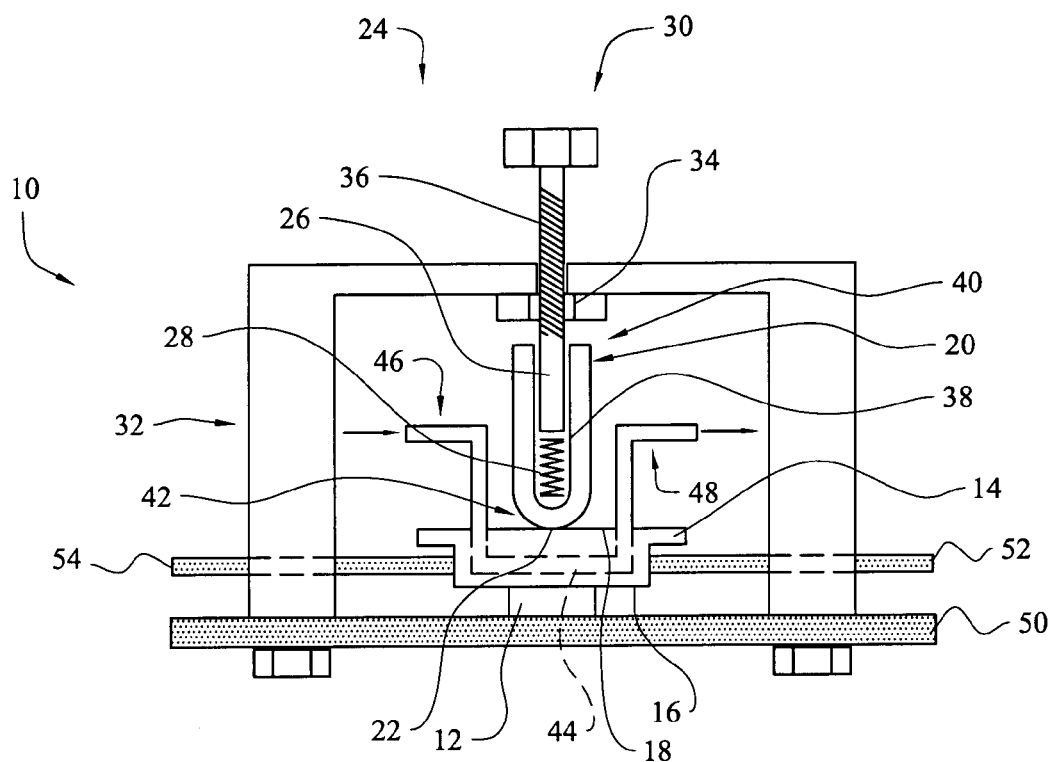
FIG. 1 is a schematic view of a first exemplary embodiment of the invention.

A plurality of different embodiments of the invention are shown in the Figures of the application. Similar features are shown in the various embodiments of the invention. Similar features have been numbered with a common reference numeral and have been differentiated by an alphabetic designation. Similar features are structured similarly, operate similarly, and/or have the same function unless otherwise indicated by the drawings or this specification. Furthermore, particular features of one embodiment can replace corresponding features in another embodiment unless otherwise indicated by the drawings or this specification.

Referring now to FIG. 1, in a first exemplary embodiment of the invention, a heat sink device 10 receives heat generated by an electrical chip 12. The electrical chip 12 is disposed on circuit card 50. The heat sink device 10 includes a cold plate 14 having a bottom surface 16 for receiving heat from the electrical chip 12 and a top surface 18 opposite of the bottom surface 16. Heat moves from the electrical chip 12 to the bottom surface 16 and then generally toward the top surface 18. If heat is not removed from the electrical chip 12, the electrical chip 12 could be damaged and/or be compromised with respect to life span.

A layer of thermal grease is disposed between the cold plate 14 and the electrical chip 12. The thickness of the layer of thermal grease is not always constant and can affect the efficiency of heat transfer between the electrical chip 12 and the cold plate 14. Therefore, it is desirable to press the cold plate 14 and the electrical chip 12 together to increase the likelihood that the layer of thermal grease will define a substantially constant thickness.

The heat sink device 10 includes a finger member 20 having a rounded tip 22 centered on the top surface 18. The heat sink device 10 also includes a force generating device 24 having an anvil 26 spaced from the finger member 20 and a compressible member 28 compressed between the anvil 26 and the finger member 20. The compressible member 28 generates a pressing force urging the finger member 20 and the top surface 18 together. In the first exemplary embodiment, the compressible member 28 is a spring. The pressing force also urges the bottom surface 16 and the electrical chip 12 together to increase the likelihood that the layer of thermal grease will define a substantially constant thickness.

The heat sink device 10 also includes a moving device 30 operable to move one of the anvil 26 and the finger member 20 relative to the other to change the pressing force generated by the compressible member 28. In the first exemplary embodiment of the invention, the moving device 30 moves the anvil 26 relative to the finger member 20. The moving device 30 is operable to move one of the anvil 26 and the finger member 20 closer to the other and further from the other to increase and decrease, respectively, the pressing force generated by the compressible member 28. This is desirable to prevent damage to the electrical chip due to excessive compressive forces while concurrently ensuring that the cold plate 14 and electrical chip 12 are urged together.

The moving device 30 includes a frame 32 operable to be substantially fixed relative to the electrical chip 12. The frame 32 of the first exemplary embodiment is bolted to the circuit card 50 and the electrical chip 12 is fixed to the circuit card 50. The frame 32 includes a threaded aperture 34 and the moving device 30 also includes a threaded shaft 36 integral with the anvil 26 and received in the threaded aperture 34. Rotation of the shaft in a first direction moves the anvil 26 toward the rounded tip 22, increasing the compression of the compressible member 28 and the pressing force. Rotation of the shaft in a second direction opposite the first direction moves the anvil 26 away from the rounded tip 22, decreasing the compression of the compressible member 28 and the pressing force.

The finger member 20 of the first exemplary embodiment includes a blind aperture 38 with an open end 40 and a closed end 42. The compressible member 28 of the first exemplary embodiment is disposed in the blind aperture 38 at the closed end 42. The anvil 26 of the first exemplary embodiment extends through the open end 40 to compress the compressible member 28 against the closed end 42. The finger member 20 and the compressible member 28 and the anvil 26 are aligned along an axis extending normal to the cold plate 14.

The cold plate 14 is moveable along the axis extending normal to the bottom surface 16. The cold plate 14 can be slidably engaged with the frame 32 to reduce the likelihood that the cold plate 14 will bend in response to the pressing force and increase the likelihood that the bottom surface 16 and the electrical chip 12 are flush with one another. The frame 32 includes slots (not visible in FIG. 1) and the cold plate 14 includes mounting projections 52, 54 received in the slots of the frame 32. The cooperation between the mounting projections 52, 54 and the slots of the frame 32 guide movement of the cold plate 14 along the axis that extends normal to the cold plate 14.

The cold plate 14 also includes a passageway 44 extending between an inlet 46 and an outlet 48 for receiving a fluid stream to absorb heat from the electrical chip 12. The fluid stream enhances heat removal and can be any type of heat exchanging fluid known in the art. Examples of heat exchanging fluid known in the art include air, water and refrigerant. The finger member 20 engages the top surface 18 between the inlet 46 and the outlet 48. The inlet 46 and the outlet 48 extend parallel to the top surface 18. The exemplary passageway 44 enters the cold plate 14 at an entry point in the top surface 18 and exits the cold plate 14 at an exit point in the top surface 18. The finger member 20 engages the top surface 18 between the entry point and the exit point in the first exemplary embodiment of the invention, as shown by FIG. 1.

Figure 2:
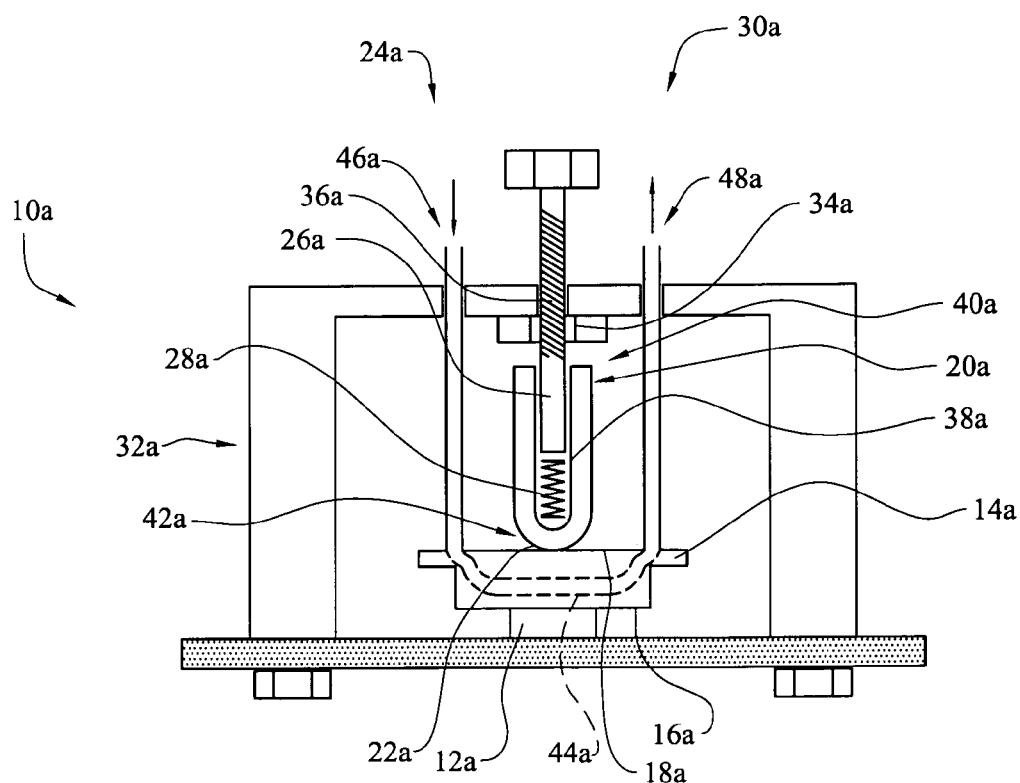
FIG. 2 is a schematic view of a second exemplary embodiment of the invention.

Referring now to FIG. 2, in a second exemplary embodiment of the invention, a heat sink device 10a receives heat generated by an electrical chip 12a. The heat sink device 10a includes a cold plate 14a having a bottom surface 16a and a top surface 18a opposite of the bottom surface 16a. The heat sink device 10a also includes a finger member 20a having a rounded tip 22a centered on the top surface 18a. The heat sink device 10a also includes a force generating device 24a having an anvil 26a spaced from the finger member 20a and a compressible member 28a compressed between the anvil 26a and the finger member 20a. The compressible member 28a generates a pressing force urging the finger member 20a and the top surface 18a together. The heat sink device 10a also includes a moving device 30a operable to move one of the anvil 26a and the finger member 20a relative to the other to change the pressing force generated by the compressible member 28a. In the second exemplary embodiment of the invention, the moving device 30a moves the anvil 26a relative to the finger member 20a.

The moving device 30a includes a frame 32a operable to be substantially fixed relative to the electrical chip 12a and has a threaded aperture 34a. The moving device 30a also includes a threaded shaft 36a integral with the anvil 26a and received in the threaded aperture 34a. The finger member 20a of the first exemplary embodiment includes a blind aperture 38a with an open end 40a and a closed end 42a. The compressible member 28a is disposed in the blind aperture 38a at the closed end 42a. The anvil 26a extends through the open end 40a to compress the compressible member 28a against the closed end 42a. The cold plate 14a includes a passageway 44a extending between an inlet 46a and an outlet 48a for receiving a fluid stream to absorb heat from the electrical chip 12a. The inlet 46a and the outlet 48a are transverse to the top surface 18a. The compressible member 28a of the second exemplary embodiment is a spring.

Figure 3:
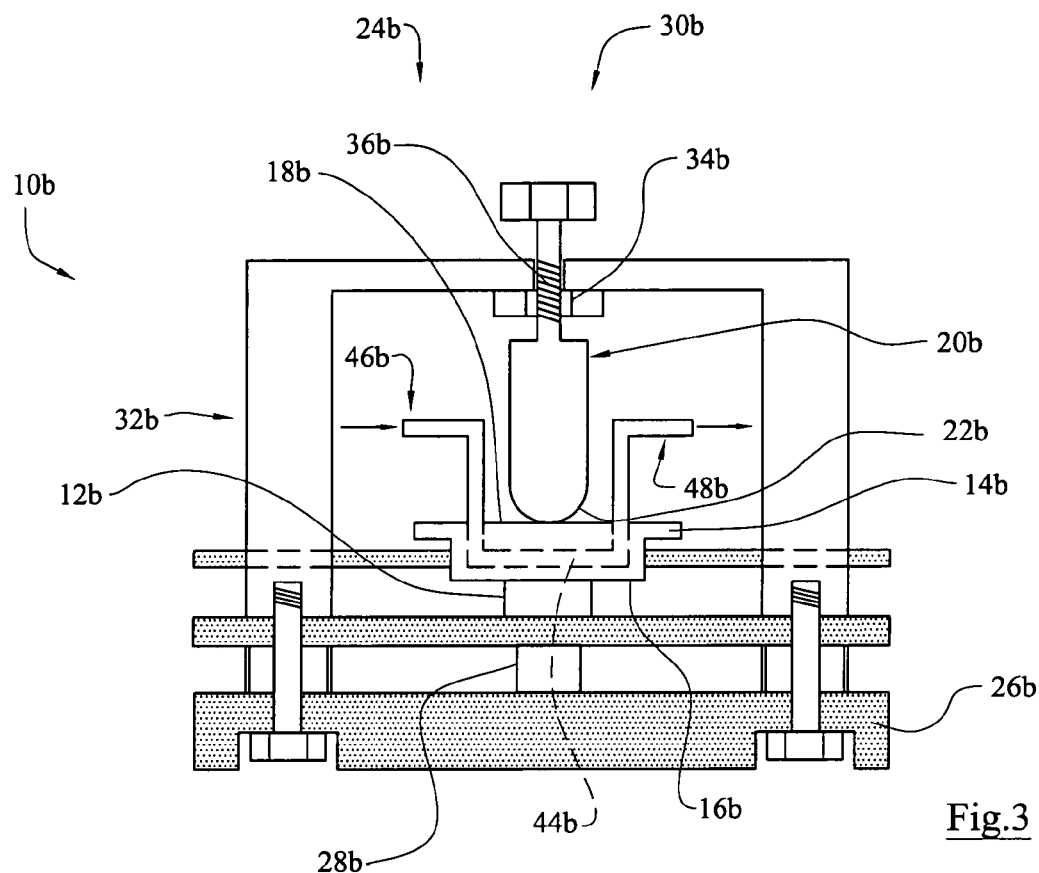
FIG. 3 is a schematic view of a third exemplary embodiment of the invention.

Referring now to FIG. 3, in a third exemplary embodiment of the invention, a heat sink device 10b receives heat generated by an electrical chip 12b. The heat sink device 10b includes a cold plate 14b having a bottom surface 16b and a top surface 18b opposite of the bottom surface 16b. The heat sink device 10b also includes a finger member 20b having a rounded tip 22b centered on the top surface 18b. The heat sink device 10b also includes a force generating device 24b having an anvil 26b spaced from the finger member 20b and a compressible member 28b compressed between the anvil 26b and the finger member 20b. The compressible member 28b generates a pressing force urging the finger member 20b and the top surface 18b together. The heat sink device 10b also includes a moving device 30b operable to move one of the anvil 26b and the finger member 20b relative to the other to change the pressing force generated by the compressible member 28b. In the third exemplary embodiment of the invention, the moving device 30b moves the finger member 20b relative to the anvil 26b.

The moving device 30b includes a frame 32b operable to be substantially fixed relative to the electrical chip 12b and has a threaded aperture 34b. The moving device 30b also includes a threaded shaft 36b integral with the finger member 20b and received in the threaded aperture 34b. In the third exemplary embodiment of the invention, the cold plate 14b is disposed between the anvil 26b and the finger member 20b. The cold plate 14b includes a passageway 44b extending between an inlet 46b and an outlet 48b for receiving a fluid stream to absorb heat from the electrical chip 12b. The compressible member 28b of the third exemplary embodiment is a rubber block.

Figure 4:
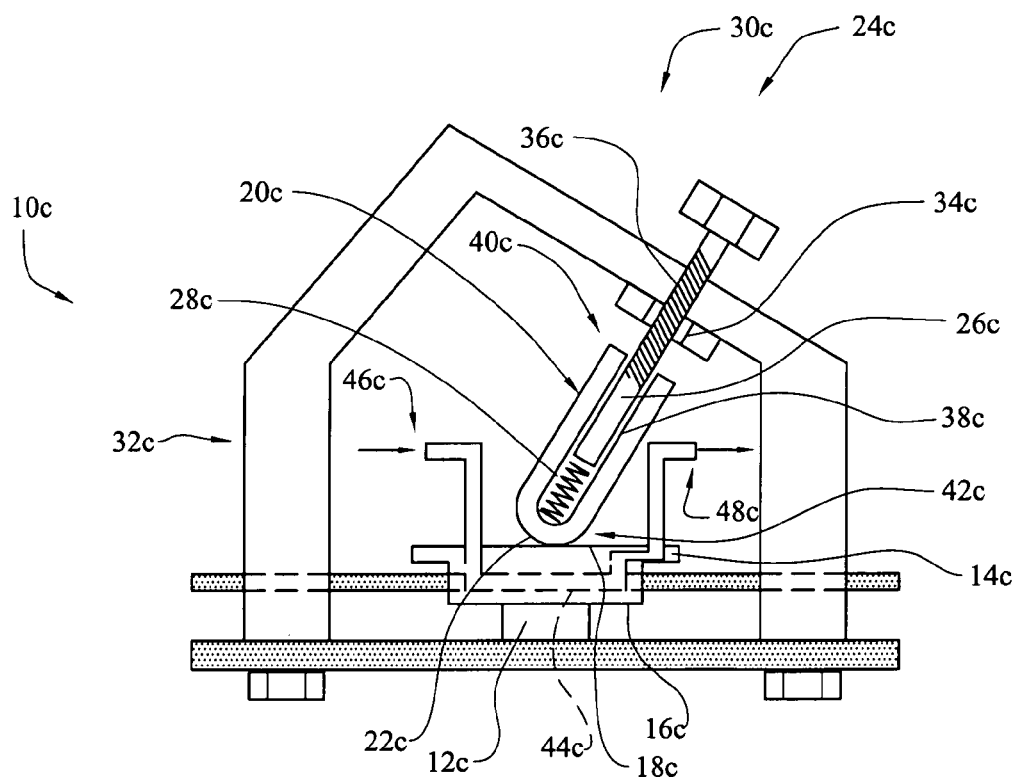
FIG. 4 is a schematic view of a fourth exemplary embodiment of the invention.

Referring now to FIG. 4, in a fourth exemplary embodiment of the invention, a heat sink device 10c receives heat generated by an electrical chip 12c. The heat sink device 10c includes a cold plate 14c having a bottom surface 16c and a top surface 18c opposite of the bottom surface 16c. The heat sink device 10c also includes a finger member 20c having a rounded tip 22c centered on the top surface 18c. The heat sink device 10c also includes a force generating device 24c having an anvil 26c spaced from the finger member 20c and a compressible member 28c compressed between the anvil 26c and the finger member 20c. The compressible member 28c generates a pressing force urging the finger member 20c and the top surface 18c together. The heat sink device 10c also includes a moving device 30c operable to move one of the anvil 26c and the finger member 20c relative to the other to change the pressing force generated by the compressible member 28c. In the fourth exemplary embodiment of the invention, the moving device 30c moves the anvil 26c relative to the finger member 20c.

The moving device 30c includes a frame 32c operable to be substantially fixed relative to the electrical chip 12c and has a threaded aperture 34c. The moving device 30c also includes a threaded shaft 36c integral with the anvil 26c and received in the threaded aperture 34c. The finger member 20c of the first exemplary embodiment includes a blind aperture 38c with an open end 40c and a closed end 42c. The compressible member 28c is disposed in the blind aperture 38c at the closed end 42c. The anvil 26c extends through the open end 40c to compress the compressible member 28c against the closed end 42c. The finger member 20c and the compressible member 28c and the anvil 26c are aligned along an axis extending less than normal to the cold plate 14c. The cold plate 14c includes a passageway 44c extending between an inlet 46c and an outlet 48c for receiving a fluid stream to absorb heat from the electrical chip 12c.

Figure 5:
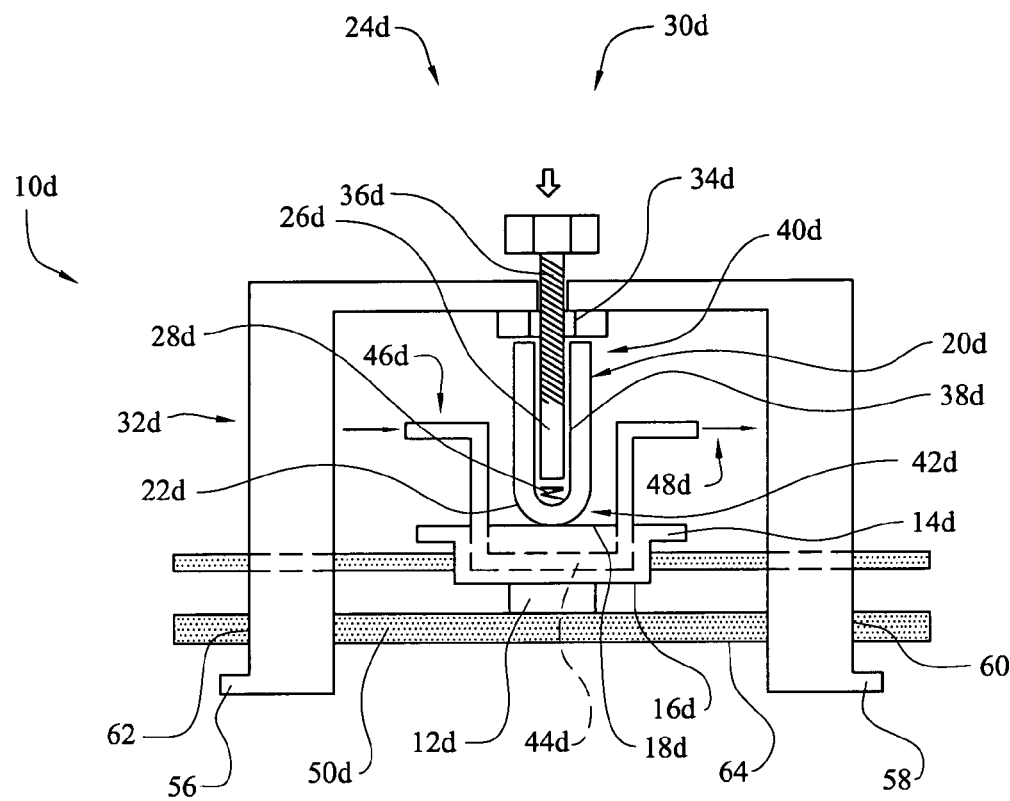
FIG. 5 is a schematic view of a fifth exemplary embodiment of the invention.

Referring now to FIG. 5, in a fifth exemplary embodiment of the invention, a heat sink device 10d receives heat generated by an electrical chip 12d. The heat sink device 10d includes a cold plate 14d having a bottom surface 16d and a top surface 18d opposite of the bottom surface 16d. The heat sink device 10d also includes a finger member 20d having a rounded tip 22d centered on the top surface 18d. The heat sink device 10d also includes a force generating device 24d having an anvil 26d spaced from the finger member 20d and a compressible member 28d compressed between the anvil 26d and the finger member 20d. The compressible member 28d generates a pressing force urging the finger member 20d and the top surface 18d together. The heat sink device 10d also includes a moving device 30d operable to move one of the anvil 26d and the finger member 20d relative to the other to change the pressing force generated by the compressible member 28d. In the fifth exemplary embodiment of the invention, the moving device 30d moves the anvil 26d relative to the finger member 20d.

The finger member 20d of the first exemplary embodiment includes a blind aperture 38d with an open end 40d and a closed end 42d. The compressible member 28d is disposed in the blind aperture 38d at the closed end 42d. The anvil 26d extends through the open end 40d to compress the compressible member 28d against the closed end 42d. The moving device 30d includes a frame 32d operable to be slidably disposed relative to the electrical chip 12d. The frame 32d can be pressed downward, toward the electrical chip 12d. The frame 32d is received in slots 60, 62 defined in a circuit card 50d. The slots 60, 62 can be arcuate such that the frame 32d can be pressed down and turned to lock the frame 32d and the circuit card 50d together. A pair of feet 56, 58 prevent the frame 32d from separating from the circuit card 50d. The feet 56, 58 can define cam surfaces such that as the frame 32d is rotated relative to the circuit card 50, the cam surfaces of the feet 56, 58 urge the feet 56, 58 away from a bottom surface 64 of the circuit card 50d to increase the compression of the compressible member 28d. The frame 32d supports the anvil 26d in movement relative to the finger member 20d. The moving device 30d also includes a threaded aperture 34d and a threaded shaft 36d integral with the anvil 26d. As a result, the compressible member 28d can be compressed or decompressed with movement of the frame 32d or with movement of the threaded shaft 36d. The cold plate 14d includes a passageway 44d extending between an inlet 46d and an outlet 48d for receiving a fluid stream to absorb heat from the electrical chip 12d.

Figure 6:
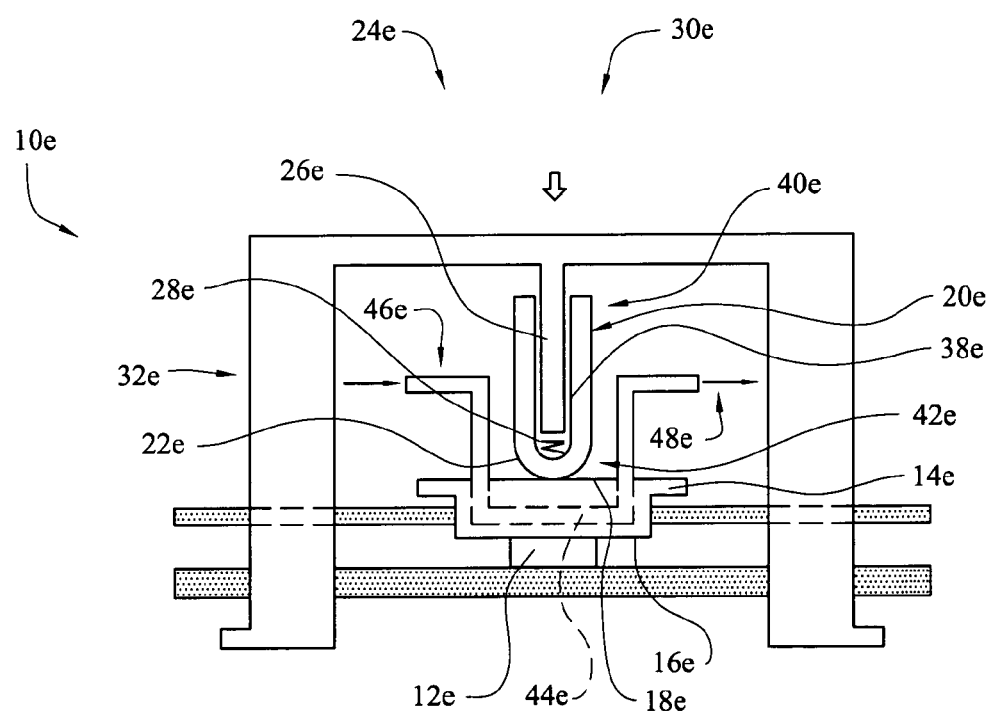
FIG. 6 is a schematic view of a sixth exemplary embodiment of the invention.

Referring now to FIG. 6, in a sixth exemplary embodiment of the invention, a heat sink device 10e receives heat generated by an electrical chip 12e. The heat sink device 10e includes a cold plate 14e having a bottom surface 16e and a top surface 18e opposite of the bottom surface 16e. The heat sink device 10e also includes a finger member 20e having a rounded tip 22e centered on the top surface 18e. The heat sink device 10e also includes a force generating device 24e having an anvil 26e spaced from the finger member 20e and a compressible member 28e compressed between the anvil 26e and the finger member 20e. The compressible member 28e generates a pressing force urging the finger member 20e and the top surface 18e together. The heat sink device 10e also includes a moving device 30e operable to move one of the anvil 26e and the finger member 20e relative to the other to change the pressing force generated by the compressible member 28e. In the sixth exemplary embodiment of the invention, the moving device 30e moves the anvil 26e relative to the finger member 20e.

The finger member 20e of the first exemplary embodiment includes a blind aperture 38e with an open end 40e and a closed end 42e. The compressible member 28e is disposed in the blind aperture 38e at the closed end 42e. The anvil 26e extends through the open end 40e to compress the compressible member 28e against the closed end 42e. The moving device 30e also includes a frame 32e operable to be slidably disposed relative to the electrical chip 12e. The frame 32e can be pressed downward, toward the electrical chip 12e. The frame 32e is integral with the anvil 26e. The cold plate 14e includes a passageway 44e extending between an inlet 46e and an outlet 48e for receiving a fluid stream to absorb heat from the electrical chip 12e.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat sink device for receiving heat generated by an electrical chip comprising:
   a cold plate having a bottom surface for receiving heat from the electrical chip and a top surface opposite of said bottom surface;
   a finger member having a tip centered on said top surface and a blind aperture extending between an open end and a closed end of said finger member;
   a force generating device having an anvil extending through said open end and spaced from said closed end and a compressible member disposed in said blind aperture and compressed between said anvil and said closed end of said finger member to generate a pressing force at least partially normal to said cold plate urging said finger member against said top surface;
   a frame operable to be at least one of substantially fixed and slidably disposed relative to the electrical chip and having a threaded aperture; and
   a moving device operable to move said anvil relative to said finger member to change said pressing force generated by said compressible member, wherein said moving device includes a threaded shaft received for rotation in said threaded aperture and fixed to said anvil to move said anvil during said rotation.

2. The heat sink device of claim 1 wherein said moving device is further defined as being operable to move said anvil closer to and further from said closed end of said blind aperture to increase and decrease, respectively, said pressing force generated by said compressible member.

3. The heat sink device of claim 1 wherein said finger member and said compressible member and said anvil are aligned along an axis extending normal to said cold plate.

4. The heat sink device of claim 1 wherein said cold plate is disposed between said anvil and said finger member.

5. The heat sink device of claim 1 wherein said cold plate is moveable along an axis extending normal to said bottom surface.

6. A heat sink device for receiving heat generated by an electrical chip comprising:
- a cold plate having a bottom surface for receiving heat from the electrical chip and a top surface opposite of said bottom surface;
- a finger member having a tip centered on said top surface and a blind aperture extending between an open end and a closed end of said finger member;
- a force generating device having an anvil spaced from said closed end of said finger member and a compressible member compressed between said anvil and said closed end of said finger member to generate a pressing force urging said finger member and said top surface together; and
- a moving device operable to move one of said anvil and said finger member relative to the other to change said pressing force generated by said compressible member;

wherein said finger member and said compressible member and said anvil are aligned along an axis extending less than normal to said cold plate.

7. A heat sink device for receiving heat generated by an electrical chip comprising:
- a cold plate having a bottom surface for receiving heat from the electrical chip and a top surface opposite of said bottom surface;
- a finger member having a tip centered on said top surface and a blind aperture extending between an open end and a closed end of said finger member;
- a force generating device having an anvil spaced from said closed end of said finger member and a compressible member compressed between said anvil and said closed end of said finger member to generate a pressing force urging said finger member and said top surface together; and
- a moving device operable to move one of said anvil and said finger member relative to the other to change said pressing force generated by said compressible member;

wherein said cold plate further comprises a passageway extending through said cold plate between an inlet and an outlet for receiving a fluid stream to absorb heat from the electrical chip and passing between said bottom surface and said tip of said finger member.

8. The heat sink device of claim 7 wherein said passageway is further defined as entering said cold plate at an entry point in said top surface and exiting said cold plate at an exit point in said top surface and wherein said finger member is further defined as engaging said top surface between said entry point and said exit point.

9. The heat sink device of claim 7 wherein said inlet and said outlet are parallel to said top surface.

10. The heat sink device of claim 7 wherein said inlet and said outlet are transverse to said top surface.

* * * * *